Figure 1:
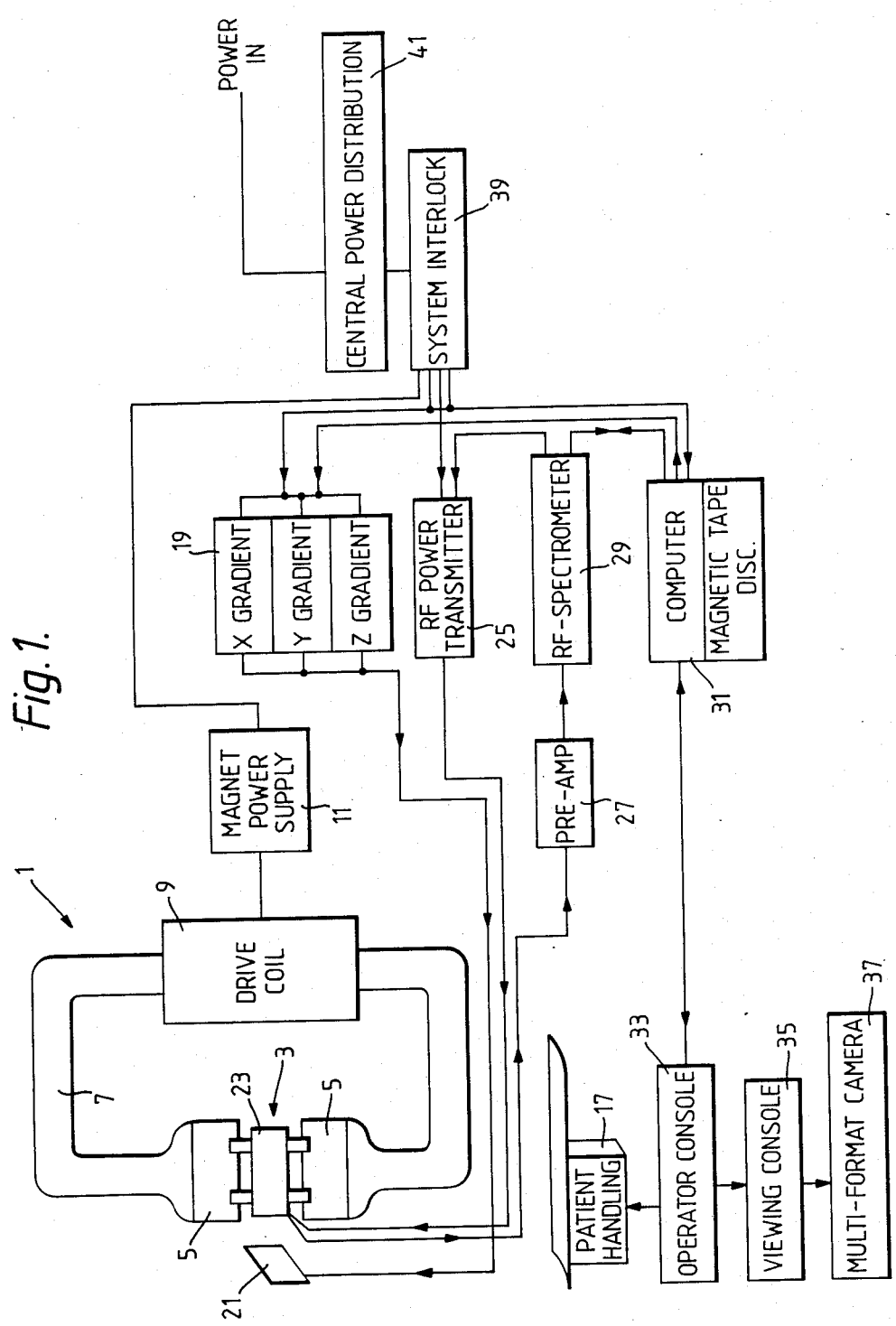

United States Patent [19]

Young et al.

[11] Patent Number: 4,882,560
[45] Date of Patent: Nov. 21, 1989

[54] COIL ARRANGEMENTS IN MAGNETIC RESONANCE APPARATUS

[75] Inventors: Ian R. Young, West Overton, Nr. Marlborough; Alasdair S. Hall, Northwood, both of England

[73] Assignee: Picker International, Ltd., Wembley, England

[21] Appl. No.: 274,827

[22] Filed: Nov. 22, 1988

[30] Foreign Application Priority Data

Nov. 25, 1987 [GB] United Kingdom ................ 8727611

[51] Int. Cl.$^4$ .............................................. H01F 5/00
[52] U.S. Cl. .................................... 335/299; 324/319
[58] Field of Search ................ 335/299, 296; 324/318, 324/319, 320, 321

[56] References Cited

U.S. PATENT DOCUMENTS 4,490,675 12/1984 Knuettel et al. ................ 335/299 X
4,779,049 10/1988 Takahashi ...................... 335/299 X

FOREIGN PATENT DOCUMENTS 0142760 5/1985 European Pat. Off. .
2145230 3/1985 United Kingdom .
2149124 6/1985 United Kingdom .

Primary Examiner—George Harris
Attorney, Agent, or Firm—Timothy B. Gurin

[57] ABSTRACT

An RF coil arrangement (23) in a magnetic resonance apparatus wherein a static magnetic field for application to a body under examination is produced in a gap (3) between a pair of pole pieces (5). The RF coil arrangement comprises at least one coil (45 or 47) having a first part (49,51) fixed secured to a part (5) of the apparatus adjacent the gap and a further part (53) which is detachably electrically connected to the first part to provide easy access to the gap when placing in, or removing from, the gap a body to be imaged. The further part of the coil may be wholly detachable from the first part or pivotally mounted on a first portion (49) of the first part and detachable from a second portion (51) of the first part on pivotal movement of the further part with respect to the first portion of the first part.

11 Claims, 3 Drawing Sheets

COIL ARRANGEMENTS IN MAGNETIC RESONANCE APPARATUS

This invention relates to coil arrangements in magnetic resonance (MR) apparatus.

More particularly the invention relates to coil arrangements in MR apparatus of the kind suitable for use in medical examination of patients, for example, to provide an image representing the distribution in a selected region of a patient of a chosen quantity, e.g. the density of chosen nucleons, for example, hydrogen protons, or MR spin relaxation time constants.

Such apparatus operates by the application to the selected region of the patient of a radio frequency (RF) magnetic excitation field in the presence of a static magnetic field of high strength, and normally also magnetic field gradients imposed on the static field, and the sensing and analysis of the resulting magnetic resonance produced in the patient's body. The RF fields may be applied, and the resulting signals sensed, by different coils, or the same coils may be used for both purposes.

In MR apparatus using a static magnetic field of relatively low strength, the static magnetic field is often produced in a gap between a pair of pole pieces, e.g. between pole pieces of a permanent magnet or between pole pieces joined by a yoke of magnetic material carrying a drive coil arrangement. The RF coils are then preferably disposed on opposite sides of the gap and supported on a part of the apparatus. In use of the apparatus the patient's body is placed in the gap, and if the patient needs to be removed from the apparatus quickly, as may happen in the case of a very sick patient, the RF coils present an obstacle to rapid removal, especially if the patient has to be provided with life support systems during the examination.

It is an object of the present invention to provide a RF coil arrangement which overcomes this problem.

According to the present invention there is provided an RF coil arrangement in a magnetic resonance apparatus of the kind wherein a static magnetic field for application to a body under examination is produced in a gap between a pair of pole pieces, the RF coil arrangement comprising at least one coil having a first part fixedly secured to a part of the apparatus adjacent said gap and a further part which is detachably electrically connected with at least a portion of said first part.

Preferably said further part comprises at least one member of said coil which extends generally from one pole piece to the other when said further part of said coil is connected to said portion of said first part of said coil.

In one particular arrangement according to the invention said further part is pivotally mounted on a first portion of said first part and detachable from a second portion of said first part on pivotal movement of said further part with respect to said first portion of said first part.

In another particular arrangement according to the invention said further part is wholly detachable from said first part.

Figure 2:
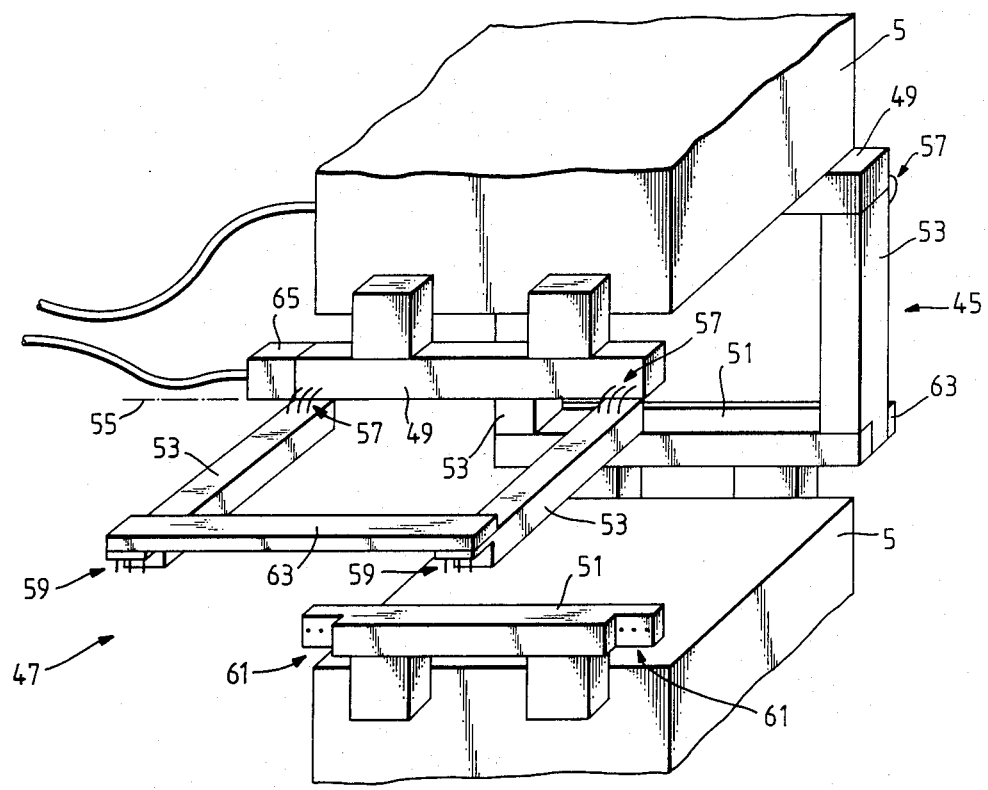
Figure 3:
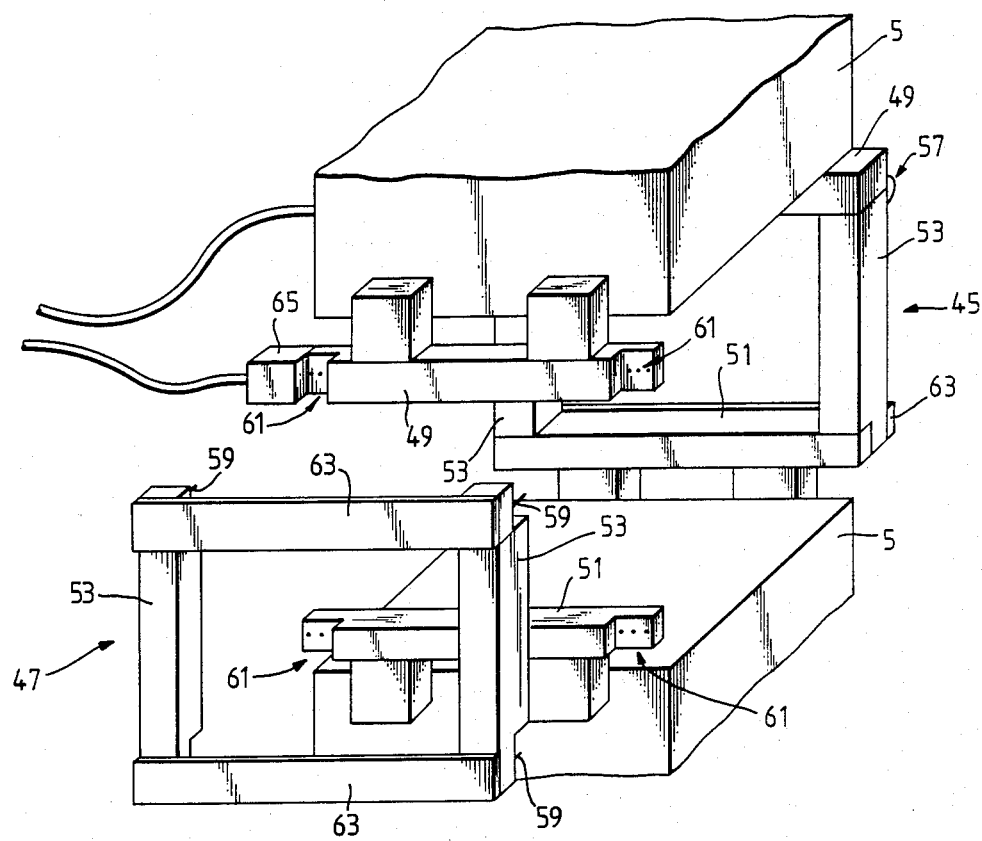

One MR imaging apparatus using an RF coil arrangement according to the invention will now be described, by way of example, with reference to the accompanying drawings in which:

FIG. 1 is a schematic diagram of the imaging system;
FIG. 2 is a diagram showing the RF coil arrangement in more detail; and
FIG. 3 is a diagram of an alternate embodiment of the present invention.

The imaging system is adapted for use in the examination of patients for medical purposes.

Referring to FIG. 1, the imaging system includes a magnet system 1 whereby a homogeneous static magnetic field is produced in a gap 3 defined by two pole pieces 5. The magnet system further includes a magnetic core 7 which joins the pole pieces 5 and carries a cryogenic drive coil arrangement 9 arranged for energisation from a power supply 11.

The gap 3, when being used for imaging, is associated with three sets of magnetic field gradient coils for imposing nominally linear magnetic field gradients on the static field in three orthogonal directions, under control of a gradient field controller 19. These gradient fields are used for selection of the region of an object under examination to be imaged, and spatial encoding of nuclear magnetic spins in known manner. In the drawing only one coil 21 adjacent the gap 3 is shown by way of example.

In addition, the gap 3 is associated with an RF coil arrangement connected to a transmitter 25 to excite NMR in the object under examination, and to pick up the resultant signals in the object.

The signals picked up by the coil arrangement 23 are amplified in a pre-amplifier 27 and analysed and processed in an RF spectrometer 29 and computer 31 under the control of an operator console 33, the console 33 being linked with an image viewing console 35 and a multi-format camera unit 37 for recording images. The overall operation of the imaging system is controlled by the computer 31 in conjunction with a system interlock 39 via which electric power is passed from a central power distribution system 41 to the RF transmitter 25, gradient field controller 19 and main magnet supply 11, in dependence on instructions passdd to the computer 31 from the operator console 33.

Fuller descriptions of NMR imaging systems and their method of operation may be found, for example, in U.S. Pat. Nos. 4,284,948 and 4,355,282.

Referring to FIG. 2, the RF coil arrangement 23 comprises two rectangular coils 45 and 47 mounted on opposite sides of the gap 3, each coil comprising several turns carried in a supporting frame of an electrically insulating material, e.g. a plastics material.

Each of the coils 45 and 47 has two horizontal members 49 and 51 which are fixedly supported from the two pole pieces 5 respectively. Each coil 49, 51 is completed by two members 53 which are hinged to the upper horizontal member 49, about a horizontal axis 55, the turns of the coil including flexible links 57 around the hinges. At its lower end each member 53 is provided with plug contacts 59 arranged to mate detachably with sockets 61 on the lower horizontal member 51 to complete the coil when the members 53 are swung into the vertical plane of the horizontal members 49 and 51. At their lower ends the members 53 are also joined by a cross support member 63 so that they move together about the hinge axis 55. A mechanical interlock 65 associated with the hinges disconnects the coil arrangement 45, 47 from the RF transmitter 25 before the plug contacts 59 disconnect from the sockets 61.

In use of the imaging apparatus, rapid removal of a patient positioned in the gap 3 is greatly facilitated by swinging the vertical members 53 and cross member 63 upwards, thus allowing withdrawal of the patient from the gap 3, together with any leads and pipes extending from the patient to life support systems positioned alongside the apparatus 3, without risk of such leads and pipes snagging on the RF coils. Positioning of a patient within the gap 3 is, of course, also facilitated.

In a modification of the arrangement of FIG. 2, the two members 53 of each coil 45, 47 are hinged to the associated member 49 for rotation about a respective one of two horizontal spaced axes orthogonal to the axis 55, with appropriate re-orientation of the plug and socket arrangements 59, 61. The two cross support members 63 are then repositioned so that the two left hand members 53 in FIG. 2 are joined by one member 63 for movement together about one hinge axis and the two right hand members 53 are joined by the other member 63 for movement together about the other hinge axis.

In a further modification of the arrangement of FIG. 2, as shown in FIG. 3, the members 53 are provided with plug contacts at their upper ends, as well as at their lower ends, which mate with sockets on the upper horizontal member 49. The members 53 may then be detached from the horizontal members 49, 51 and completely removed to facilitate withdrawal of a patient.

It will be understood that whilst in the arrangement in accordance with the invention described above by way of example the parts of the RF coil arrangement fixedly secured to a part of the MR apparatus are secured to the pole pieces of the magnet system, such parts of the RF coil arrangement may be secured to other parts of an MR apparatus in other arrangements according to the invention. Furthermore, in other arrangements in accordance with the invention the detachable part or parts of the RF coil arrangement may comprise parts which extend other than vertically when in an operative position.

We claim:

1. An RF coil arrangement in a magnetic resonance apparatus including a pair of pole pieces which define a gap in which a static magnetic field for application to a body under examination is produced, the RF coil arrangement comprising at least one coil having a first part fixedly secured to a part of the magnetic resonance apparatus adjacent said gap and a further part which is detachably electrically connected with at least a portion of said first part.

2. An RF coil arrangement according to claim 1 wherein said further part comprises at least one member of said coil which extends generally from one pole piece to the other when said further part of said coil is connected to said portion of said first part of said coil.

3. An RF coil arrangement according to claim 1 wherein said further part is pivotally mounted on a first portion of said first part and detachable from a second portion of said first part on pivotal movement of said further part with respect to said first portion of said first part.

4. An RF coil arrangement according to claim 1 wherein said further part is wholly detachable from said first part.

5. An RF coil arrangement according to claim 1 wherein said coil is of substantially rectangular form, said first part of said coil comprises one pair of opposite sides of said coil, and said further part of said coil comprises at least one of the other pair of opposite sides of said coil.

6. An RF coil arrangement according to claim 5 wherein said further part of said coil comprises both of said other pair of opposite sides of said coil.

7. An RF coil arrangement according to claim 6 wherein said other pair of opposite sides are joined by a cross member so as to be detachable together.

8. An RF coil arrangement according to claim 1 comprising two said coils, one on either side of said gap.

9. An RF coil arrangement according to claim 5 comprising two said coils, one on either side of said gap wherein said further parts of said coils comprise respectively corresponding ones of the other pairs of opposite sides of the coils and said further parts are joined by a cross member so as to be detachable together.

10. An RF coil arrangement according to claim 1 wherein said part of said apparatus comprises part of a magnet system providing said static magnetic field.

11. An RF coil arrangement according to claim 10 wherein said part of the apparatus comprises said pair of pole pieces.

* * * * *